United States Patent [19]

Rashleigh

[11] 4,442,350
[45] Apr. 10, 1984

[54] FIBER OPTIC SENSOR WITH ENHANCED IMMUNITY TO RANDOM ENVIRONMENTAL PERTURBATIONS

[75] Inventor: Scott C. Rashleigh, Alexandria, Va.

[73] Assignee: The United States of America as represented by the Secretary of the Navy, Washington, D.C.

[21] Appl. No.: 293,589

[22] Filed: Aug. 17, 1981

[51] Int. Cl.³ .............................................. G01B 11/16
[52] U.S. Cl. ..................................... 250/227; 356/33; 350/375; 73/657; 324/96
[58] Field of Search ............. 250/227, 231 R; 356/33, 356/73.1; 350/375, 96.29, 96.3; 324/96, 244; 73/655–657

[56] References Cited

U.S. PATENT DOCUMENTS

| 4,173,412 | 11/1979 | Ramsay et al. | 356/33 |
| 4,179,217 | 12/1979 | Robert et al. | 356/33 |
| 4,255,018 | 3/1981 | Ulrich et al. | 350/375 |
| 4,368,645 | 1/1983 | Glenn et al. | 356/33 X |

FOREIGN PATENT DOCUMENTS 21300407 12/1972 Fed. Rep. of Germany ........ 324/96

OTHER PUBLICATIONS

Imoto et al; "Polarization Dispersion Measurement in Long Single-Mode Fibers with Zero Dispersion Wavelength at 1.5 μm"; IEEE Journal of Quantum Elec., vol. QE-17, No. 4, Apr. 1981, pp. 542–545.

*Primary Examiner*—David C. Nelms
*Assistant Examiner*—Edward P. Westin
*Attorney, Agent, or Firm*—Robert F. Beers; William T. Ellis; Kenneth E. Walden

[57] ABSTRACT

A sensor is provided for sensing or detecting the presence of an environmental field condition such as acceleration, temperature change, magnetic or acoustic fields. The field is sensed by interference between two mutually orthogonal polarized eigenmodes in a single monomode optical fiber which may be disposed either linearly or wound on a mandrel made of compliant material for sensing an acoustic field, or made of magnetostrictive material for sensing a magnetic field. Polarized light propagated through the optical fiber is detected at its outlet independent of environmentally induced low frequency variations whereby the sensor may be maintained at quadrature and maximum sensitivity.

18 Claims, 21 Drawing Figures

TYPICAL

TYPICAL
TWO FIBER SENSORS
INTERFEROMETRIC ARRANGEMENTS

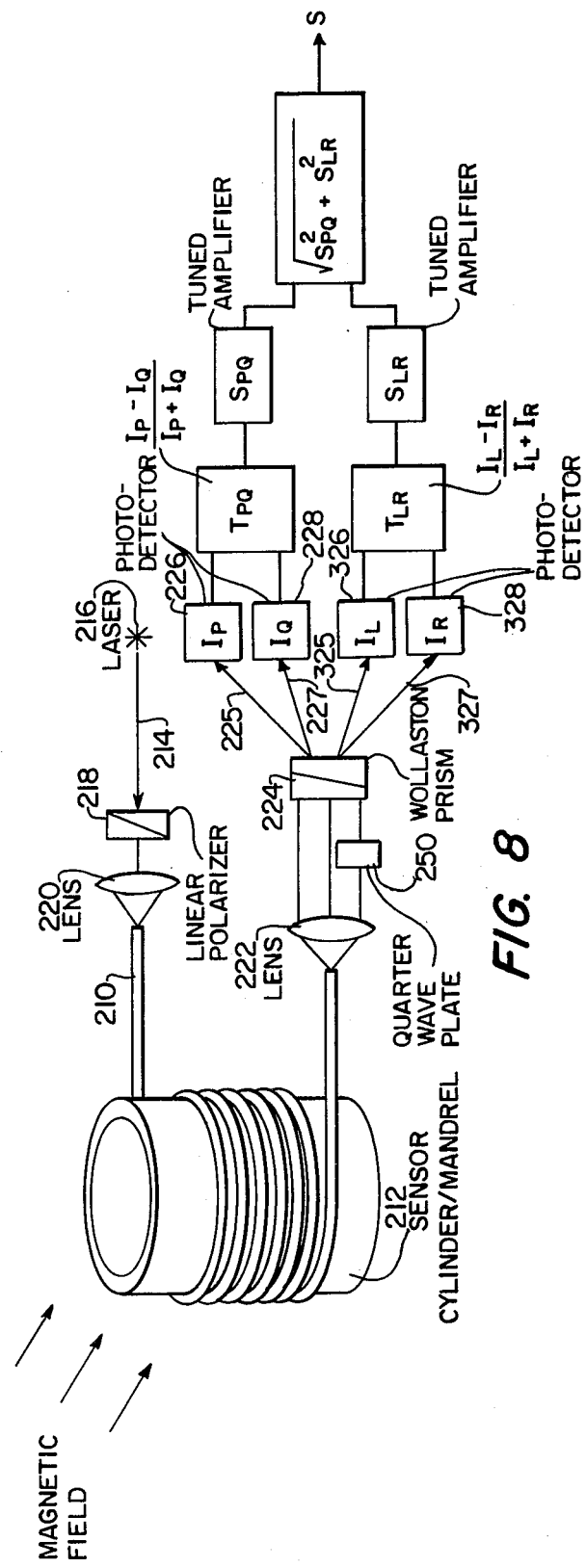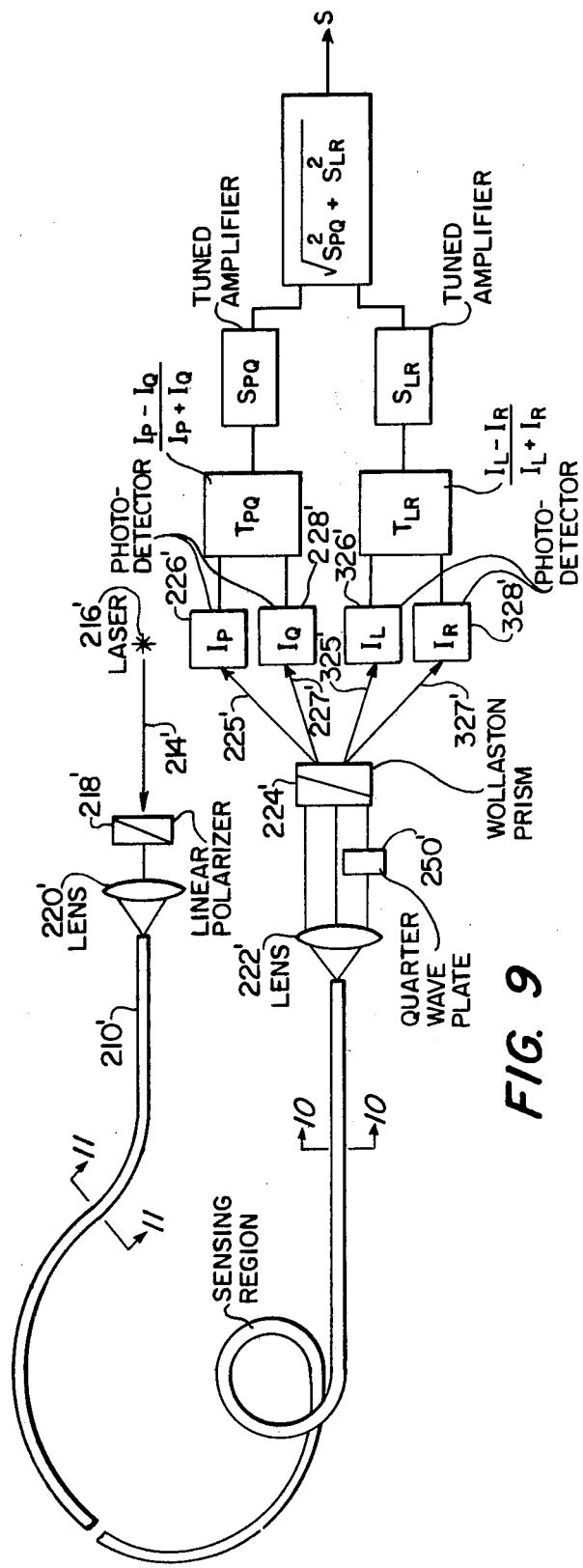
FIG. 8
FIG. 9

$$T_{PQ} = \frac{I_P - I_Q}{I_P + I_Q}$$

$$T_2 = \frac{I_L - I_R}{I_L + I_R}$$

FIBER OPTIC SENSOR WITH ENHANCED IMMUNITY TO RANDOM ENVIRONMENTAL PERTURBATIONS

BACKGROUND OF THE INVENTION

Several fiber-optical acoustic sensors have been developed in the recent past. These operate according to one of the following principles.

Two single-mode optical fibers are arranged in the form of an interferometer in which a length of one of the fibers is subjected to a magnetic or acoustic pressure field and forms the sensing arm. The other fiber is shielded from the field and forms the reference arm. Then, by the photoelastic effect, a phase change is induced in the light propagating in the sensing fiber. Recombining the light from the sensing arm with that from the reference arm results in interference fringes which give a measure of the magnitude of the magnetic field or the magnitude of the acoustic wave. The two-fiber interferometer arrangement is very sensitive to changes in environmental conditions, such as temperature, pressure, air currents, for example, which also introduce phase changes in the propagating light. Because the two fiber arms are physically separate, differential environment conditions face each and seriously affect the interferometer stability. As well, the state of polarization (SOP) of the light emerging from each fiber arm must be correct (and remain so) or the two will not completely interfere. Currently available single-mode fibers cannot maintain a specified SOP and, as the SOP in the fibers change, fringe visibility may fall to zero. U.S. Pat. No. 4,162,397 issued July 24, 1979 to Joseph A. Bucaro et al. for Fiber Optic Acoustic Sensor discloses a two fiber acoustic sensor wherein acoustic waves incident on the coil changes its index of refraction at the region of incidence. The index change causes a phase shift in the transmitted light which is detectable to denote the presence of sound waves.

The above interferometer can be arranged such that both the light paths propagate within the same fiber which may be either multimode or support only a few modes. In this case, the field condition changes the phase of all the propagating modes which interfere to produce a complex interference pattern at the fiber output. Probing this pattern with a suitable aperatured detector gives a signal proportional to the magnitude of the magnetic or acoustic field condition, but the approach is wasteful of light as only a portion of the transmitted light can be utilized. If selective excitation at the input is used to excite only two modes of the fiber, then mode conversions due to imperfections can lead to problems. The single fiber inerferometer has one advantage in that it does not require beamsplitting devices.

Another principle is disclosed in U.S. Pat. No. 4,342,907. When a light carrying fiber is bent, some of the guided light is leaked or radiated therefrom. A light carrying fiber is arranged to lie between two corrugated plates which, when subjected to an acoustic wave, bend (strain) the fiber in induce light losses therefrom to modulate the transmitted light in proportion to the magnitude of the acoustic wave signal. With this approach, problems arise when the surrounding pressure changes significantly.

U.S. Pat. No. 4,173,412 relates to a sensor based upon the measurement of strain induced in an optical fiber by stressing it perpendicular to its lontigudinal axis. The fiber has no initial birefringence or any means of introducing it. The invention described herein discloses details including the introduction of large birefringence in the fiber by winding it under tension on a small diameter cylinder or mandrel so as to introduce large initial birefringence. This large birefringence introduced by the tension coiling is essential for the sensor to operate stably.

SUMMARY OF THE INVENTION

It is an object of the invention to provide a sensor for sensing or detecting the presence of an environmental condition such as acceleration, temperature change, magnetic or acoustic fields.

It is another object of the invention to provide a sensor wherein the sensing element is in the form of a single longitudinal monomode fiber intrinsically formed or stressed to provide birefringence and a means of causing phase shifts (related to environmental conditions) between the fast and slow modes.

It is still anothwer object of the invention to provide a sensor in the form of a single monomode longitudinal fiber which may be either linearly disposed or wound on a mandrel of magnetostrictive material (for detecting magnetic fields) or of compliant material (for detecting acoustic fields) which introduce birefringence and cause phase shifts which are related to environmental conditions.

It is yet another object of the invention to provide a sensor for sensing environmental conditions independent of random environmental perturbations.

BRIEF DESCRIPTION OF THE DRAWINGS

FIG. 8 is a schematic illustration of another embodiment of the compact magnetic sensor.

FIG. 9 is a schematic illustration similar to that in FIG. 8, but showing a single optical fiber extended over a considerable distance for detecting an enrivonmental condition.

DETAILED DESCRIPTION OF THE PREFERRED EMBODIMENTS

Figure 1:
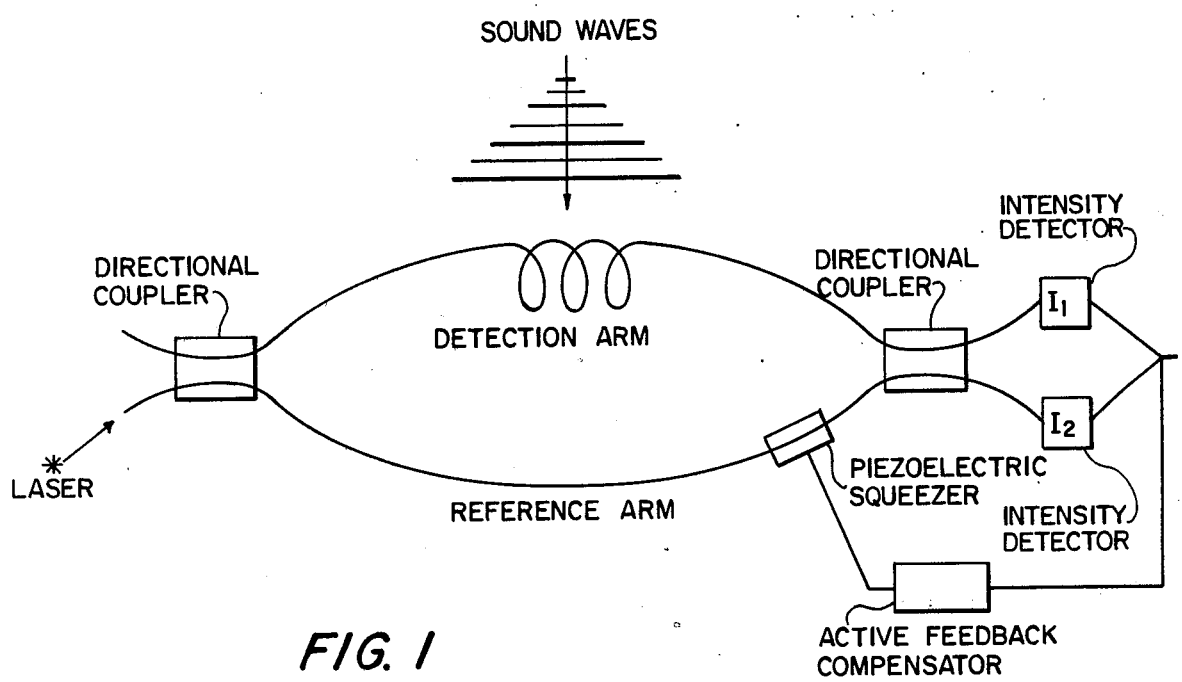
FIG. 1 is a schematic illustration of a two fiber Mach-Zender interferometric arrangement defining an acoustic sensor according to the prior art.
Figure 2:
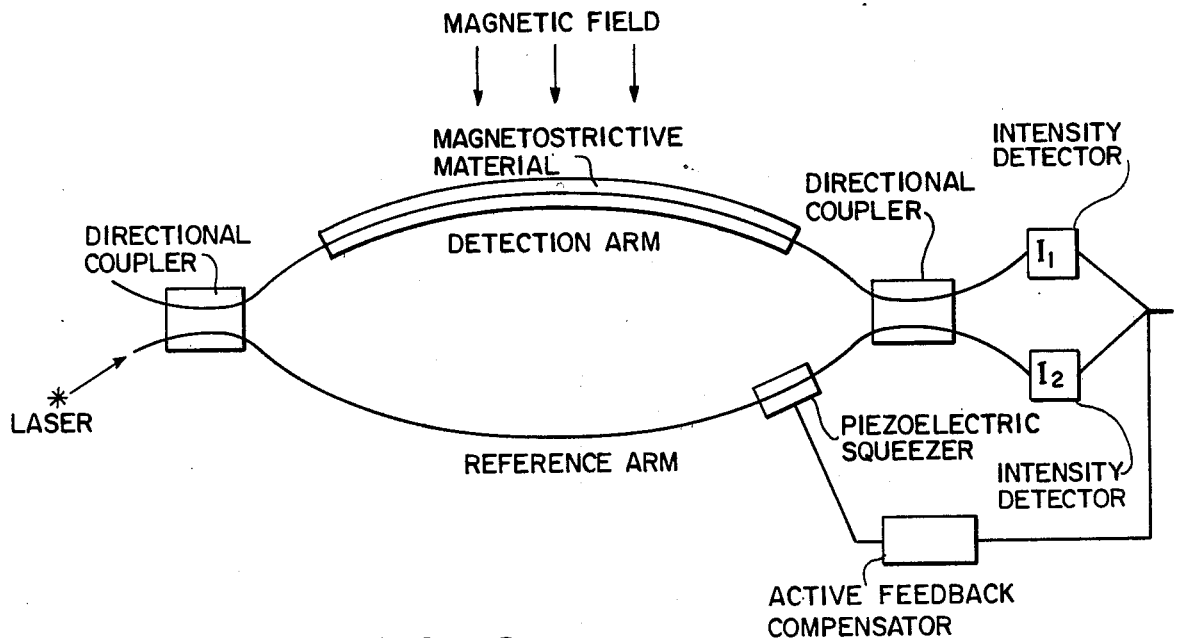
FIG. 2 is a schematic illustration of a two fiber Mach-Zender interferometric arrangement defining a magnetic sensor according to the prior art.

Referring first to FIGS. 1 and 2 of the drawings, there are illustrated typical prior art Mach-Zehnder type two fiber inerferomatric arrangements for sensing acoustic and magnetic fields. FIG. 1 illustrates an acoustic sensor for sensing sound waves such as in a fluid medium. There are provided two optical fibers for establishing separate optical paths of substantially the same length—one defining a detection arm, exposed to acoustic waves, and the other defining a reference arm, isolated from the acoustic waves. Laser light is coupled equally into these arms and propagates therethrough to detectors which provide intensity readings $I_1$ and $I_2$. In the absence of acoustic pressure on the detection arm, the two modes propagate through the arms and remain in phase upon arrival at the detectors, and no interference is detected. However, when subjected to the pressures of an acoustic field, the optical fiber of the detection arm undergoes physical changes (length, diameter and index of refraction) which causes a phase delay relative to the mode propagating through the reference arm. When the modes are recombined, they arrive at detectors $I_1$ and $I_2$ with their phases shifted a detectable amount. This provides an indication of the presence of an acoustic source. The schematic illustration in FIG. 2 is for sensing a magnetic field. It operates in much the same manner as the acoustic sensor except that a portion of the optical fiber defining the detection arm is coated with or adhered to a magnetostrictive material, such as nickel, which, in the presence of a magnetic field, undergoes dimensional changes to strain the fiber and cause physical changes (length, diameter and index of refraction) similar to that in FIG. 1. This causes a phase shift in light passing therethrough which is detected by the detectors producing $I_1$ and $I_2$. Each arrangement may be provided with means for compensating or filtering out unwanted signals of low frequencies such as may be caused by thermal or extraneous acoustic waves. The sensors then respond to fields which have a frequency above a specified low frequency, typically greater than 100 Hz.

Before referring to the other drawing figures which are specifically directed to the invention herein, background discussion will be provided regarding the nature and condition of the optical fibers used in this invention. Real single mode optical fibers cannot propagate any arbitrary state of polarization (SOP) unchanged, even in the absence of environmental perturbations. This is because a real single mode optical fiber actually has two eigenstates or modes which are orthogonally polarized. Imperfections in the fiber cause the eigenmodes to be non degenerate, and the fiber exhibits a linear birefringence $\beta_i = \Delta k_i$ is the difference between the propagation constants of the two modes. In general, the orientation of the two eigenmodes is determined by the optical fiber core shape and stresses within the fiber. For example, an optical fiber having an elliptical cross section, or a round cross section subjected to asymmetrical stresses, exhibits such birefringence.

Figure 3:
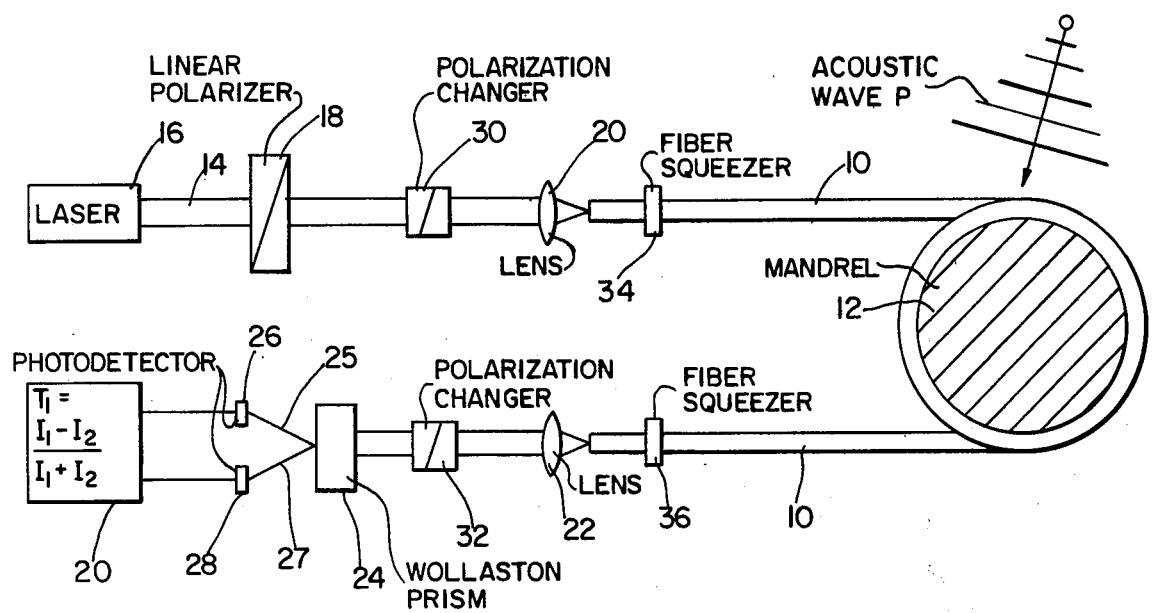
FIG. 3 is a schematic illustration of a compact single monomode optical fiber acoustic sensor according to the present invention.

When a single mode optical fiber is bent into a coil such as around a cylinder (such as illustrated in FIG. 3 described later in the specification), an additional linear birefringence $\beta_b + \beta_{tc}$ (due to bending and tension-coiling) is introduced into the fiber and the eigenmodes of this birefringence are linearly polarized parallel and perpendicular to the axis of the bending. As such, the two eigenmodes define orthogonally disposed fast and slow axes in the optical fiber. For a freely bent fiber $\beta_b = \Delta k_b = aC^2A^2$ where $\Delta k_b$ is the difference between the propagation constants of the two modes, C is the curvature of the bend of radius R (C=1/R), A is the fiber outside radius and a is a material constant ($a = 1.34 \times 10^6$ rad/meter at a wavelength of 633 nanometers). If the bending radius R is sufficiently small, the optical fiber is made strongly birefringent, and polarized light when launched into one of the eigenmodes propagates without coupling to the other eigenmode, even when the fiber is moderately perturbed, such as by an acoustic pressure. Bending the fiber under tension introduces an additional birefringence $\beta_{tc} = \Delta k_{tc} = b\epsilon CA$ where $\Delta k_{tc}$ is the difference between the propagation constants of the two modes, $\epsilon$ is the longitudinal strain (relative elongation) in the fiber and b is a material constant ($b = 4.9 \times 10^6$ at a wavelength of 633 nanometers). C and A have been defined above. This $\beta_{tc}$ makes the fiber even more strongly birefringent. When $\beta_b + \beta_{tc} < < \beta_i$, the influence of $\beta_i$ is negligible and only $\beta_b + \beta_{tc}$ need be considered.

Referring now to FIG. 3, there is shown in schematic illustration an acoustic sensor according to the invention wherein a length of single monomode optical fiber 10 is helically wound about cylinder or mandrel 12 (which defines a carrier) formed of resilient material, such as rubber, so as to be compliant to the pressures of an acoustic wave P. Light 14 from laser 16 is coupled through linear polarizer 18 and focused by lens 20 into the core of optical fiber 10. The light is coupled out of the fiber by lens 22 and passed to Wollaston prism 24 where it is split into two mutually orthogonal lineraly polarized components 25 and 27. These components are incident upon respective photodetectors 26 and 28 and their photocurrents $I_1$ and $I_2$ are processed electronically at 20 to produce a signal proportional to $T_1 = (I_1 - I_2)/(I_1 + I_2)$. Polarization changing devices 30 and 32 (e.g. Soleil-Babinet compensators) may be employed at the fiber input and output, respectively, to insure that the state of polarization is correct in the fiber as it propagates around mandrel 12 and arrives at Wollaston prism 24. The necessary polarizing changes may be acomplished instead with suitably oriented fiber squeezers 34 and 36 applied at the inlet and outlet, respectively, of fiber 10.

When an acoustic pressure wave represented by $P = P \sin \omega_s t$ is incident upon mandrel 12, with optimum adjustments of the polarizing components, the detected signal is given by the formula $T_1 = (I_1 - I_2)/(I_1 + I_2) = -\sin(f P \sin \omega_s t)$, where f is a factor representing the coupling efficiency between the acoustic wave of the pressure amplitude P on the fiber, $\omega_s$ is the angular frequency of the acoustic wave, and t represents time. Processing $T_1$ electronically gives a signal T=arc sin $T_1$=f P sin $\omega_s$ t. That is, $T_1$ has the same frequency as the acoustic pressure wave, and its amplitude is linearly related to the amplitude of the acoustic wave. Alternately, writing $T_1$ in expanded form as $T_1$=2 $J_1$ (fP) sin $\omega_s t$+2 $J_3$ (fP) sin 3 $\omega_s t$+ . . . where $J_n$ is the n-th order Bessel function shows that by filtering the signal at the acoustic frequency $\omega_s$ results in the signal $T_1$=2 $J_1$ (fP). For small values of fP, the detected signal is linearly related to the amplitude of the acoustic pressure P. Processing the photocurrents $I_1$ and $I_2$ in the form $T_1=(I_1-I_2)/(I_1+I_2)$ removes any intensity changes or noises in the laser source.

Figure 4:
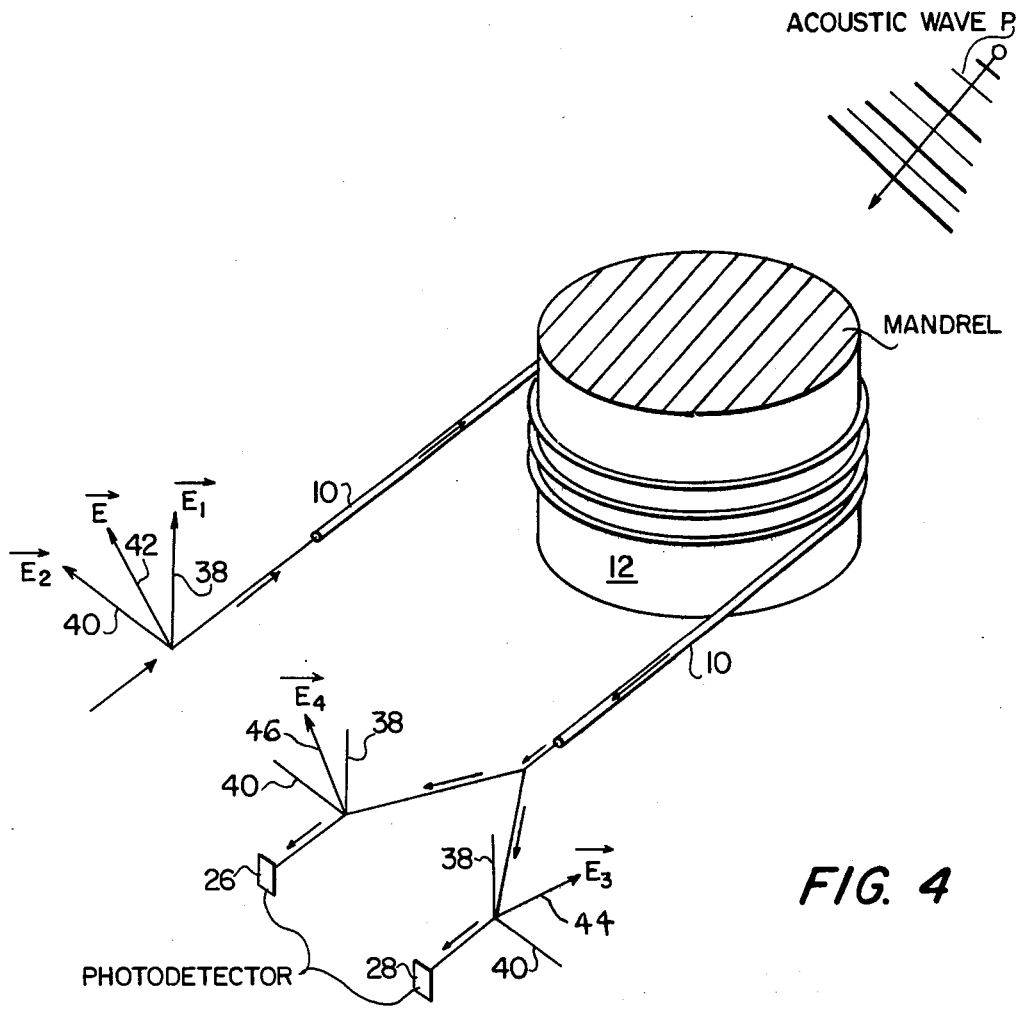
FIG. 4 is a schematic illustration in prospective view of the acoustic sensing portion of FIG. 3 for illustrating its principle of operation.

Refer now to FIG. 4 where the principle of operation is emphasized by the acoustic wave being detected by the phase interference between two eigenmodes. $\vec{E}_1$ (38) and $\vec{E}_2$ (40) represents the transverse electric field vectors of the two eigenmodes of optical fiber 10. Input polarizer 18 and polarization changer 30 (or squeezer 34) are adjusted to launch light into the fiber so that it is polarized with its electrical vector $\vec{E}$ (42) at $\pi/4$ (45°) to both $\vec{E}_1$ (38) and $\vec{E}_2$ (40). This insures that the two eigenmodes are equally excited. At the output of optical fiber 10, Wollaston prism 24 (illustrated in FIG. 3) is adjusted so that its linerally polarized output states $\vec{E}_3$ (44) and $\vec{E}_4$ (46) are at $\pi/4$ (45°) to the transverse field vectors of the eigenmodes of optical fiber 10. Photodetectors 26 and 28 are provided for receiving each $\vec{E}_3$ and $\vec{E}_4$ and processing them electronically to produce a signal proportional to $T_1=(I_1-I_2)/(I_1+I_2)$.

Compliant mandrel 12 should be chosen to maximize both $\Delta l$ (fiber length change) and $\Delta\beta$ (total fiber birefringence change) for maximizing the acoustic induced phase change. Optical fiber 10 may be wound around the surface of compliant mandrel 12, as illustrated in FIGS. 3 and 4, or imbedded therein. Embedding the fiber in, or bonding it to, the mandrel is preferred as the total fiber birefringence change $\Delta\beta=\Delta\beta_b+\Delta\beta_{tc}+\Delta\beta_f$ is larger. $\Delta\beta_b+\Delta\beta_{tc}$ is the change in bending plus tension-coiling birefringence which results from a change in diameter of the mandrel. $\Delta\beta_f$ is the change in birefringence that occurs when the fiber is squashed transversely, and results when the mandrel changes its length under the action of the acoustic pressure. This $\Delta\beta_f$ occurs only if the fiber is embedded in, or bonded to, the mandrel. This $\Delta\beta_f$ is usually much larger than $\Delta\beta_b+\Delta\beta_{tc}$.

Figure 5:
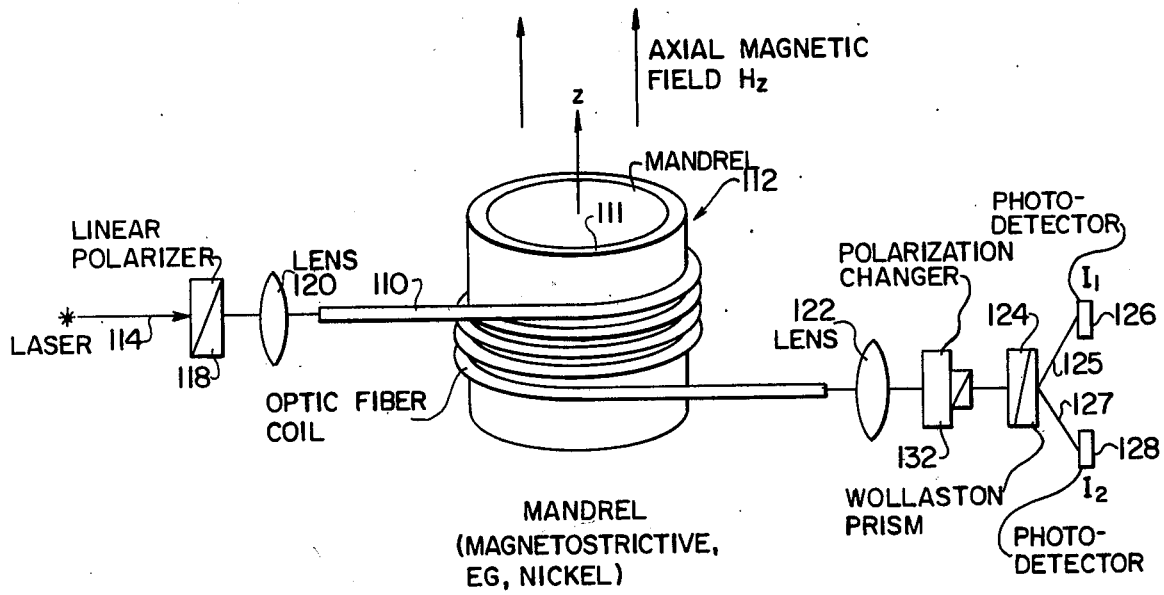
FIG. 5 is a schematic illustration of a compact monomode optical fiber magnetic sensor according to the present invention.

A variation in the invention is illustrated in FIG. 5 for sensing a magnetic field. It essentially follows the scheme set out in FIGS. 3 and 4, but is provided with a mandrel 112 of magnetostrictive material about which the optical fiber is wound.

In much the same manner as described in FIGS. 3 and 4, light 114 from the laser is passed through linear polarizer (LP) 118, focused through entrance lens 120, and coupled into the end of optical fiber 110. The light after traversing the optical fiber disposed about mandrel 112 exits through lens 122 to a polarization changing device (SBC) 132, e.g. a Soleil-Babinet compensator. From there it passes to Wollaston prism 124 where it is split into two mutually orthogonal linearly polarized components 125 and 127. The photodetectors 126 and 128 are disposed in the paths of the components and their photocurrents $I_1$ and $I_2$ are processed electronically to produce the signal $T_1=(I_1-I_2)/I_1+I_2)$.

Optical fiber 110 is coiled around (preferably embedded in or bonded to) the relatively thin wall 111 of a cylindrical tube or mandrel 112 (carrier) of magnetostrictive material, e.g. nickel. In this way, all the strain induced in the magnetostrictive material by the presence of a magnetic field is imparted to optical fiber 110. Optical fiber 110 may be an isotropic fiber wound on the mandrel with an axial strain so as to induce large birefringence $\beta_b+\beta_{tc}$ in the fiber. This establishes the polarization eigenmodes as parallel and perpendicular to the axis of mandrel 112 as described with reference to FIGS. 3 and 4. Alternately, the fiber may be made initially highly birefringent with large $\beta_i$ and positioned about the mandrel with its polarization eigenmodes parallel and perpendicular to the mandrel axis.

In the presence of a magnetic field, mandrel 112 undergoes dimensional changes resulting in an axial strain according to the formula $\epsilon_z=d_{33}H_{ac}$, where $d_{33}$ is the dynamic magnetostrictive constant and $H_{ac}$ is the magnetic field to be detected. Associated with this axial strain $\epsilon_z$ is the radial strain $\epsilon_r$ and circumferential strain $\epsilon_\theta$ which are related to the axial strain by the Poisson's ratio of the magnetostrictive material. The strains $\epsilon_r$ and $\epsilon_\theta$ result in the birefringence changes $\Delta\beta_b+\Delta\beta_{tc}$. The axial strain $\epsilon_z$ (together with radial strain $\epsilon_r$) stretch the fiber in the transverse Z-direction and introduces birefringence change $\Delta\beta_f$. This introduced birefringence change $\Delta\beta_f$ has its polarization eigenmodes parallel and perpendicular to the mandrel axis and so adds to or subtracts (depending upon the actual sensor configuration) from birefringence already introduced into the optical fiber.

Figure 6:
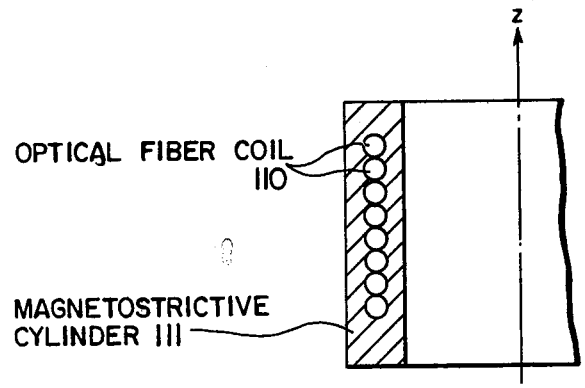
FIG. 6 is a greatly enlarged cross sectional view through the wall of the magnetostrictive cylinder in FIG. 5 illustrating the optical fibers imbedded therein.
Figure 7:
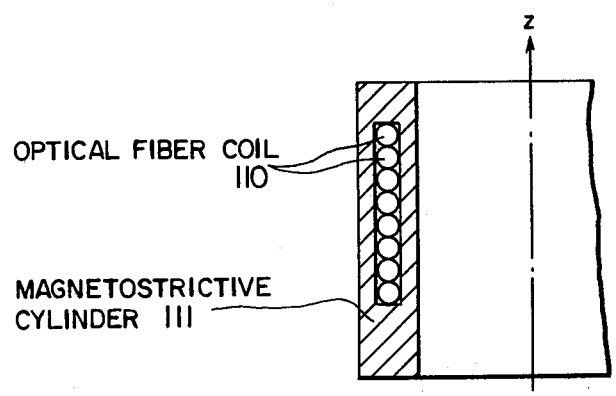
FIG. 7 is a greatly enlarged cross sectional view taken through the wall of the magnetostrictive cylinder in FIG. 5 showing a different arrangement for containing the optical fibers therein.

FIGS. 6 and 7 are enlarged cross sectional representations taken through wall 111 of mandrel 112 illustrating two alternate embodiments for containing optical fibers in wound position to maximize the birefringence change.

There is disclosed in FIGS. 8 and 9 further embodiments defining a sensor for a magnetic field, acoustic waves and temperature changes. It is adapted for operation at maximum sensitivity, but at the same time it does not suffer from usual environmental instability problems which normally lead to signal fading. The FIG. 8 embodiment contains elements arranged much in the same manner as in FIG. 5, for example, up to exit lens 222. Light 214 from laser 216 is launched into birefringent optical fiber 210 and is transported therethrough about cylindrical or tubular mandrel 212 to lens 222. A quarter wave plate (QWP) 250 is disposed across a portion of the collimated light output from lens 222 in front of Wollaston prism 224. Two photodetectors 226 and 228 are provided, as in FIG. 3 and FIG. 5, for receiving the separate mutually orthogonal linear polarized components 225 and 227, respectively. Two additional photodetectors 326 and 328 are placed in the circularly polarized components 325 and 327, respectively, at the light output from Wollaston prism 224.

If detectors 226 and 228 are oriented to detect light intensities of the plane polarized states, the detected photo current signal is $T_{PQ}=(I_P-I_Q)/(I_P+I_Q)$ which corresponds to the formula $T_1=(I_1-I_2)/(I_1+I_2)$, previously identified with the FIG. 5 embodiment. Detectors 326 and 328 detect light intensities in the left and right circularly polarized states 325 and 327 respectively giving the photocurrent signal $T_{LR}=(I_L-I_R)/(I_L+I_R)$. Where $I_P$ and $I_Q$ are the detected intensities in the plane polarized state, $I_L$ and $I_R$ are the detected intensities in the left and right circularly polarized states.

Sensors suffer from environmentally induced instabilities which cause them to drift out of quadrature. This leads to reduced sensitivity and occasional signal fading. For assuring operation of the sensor at maximum senstivity (quadrature) the phase difference between the two mutually orthogonal polarization eigenmodes is adjusted to be $\pi/2$ (90°). However, fiber sensitivity to environmental conditions such as temperature and pressures may cause a phase shift as much as to completely cancel the original $\pi/2$ phase difference to cause complete fading of small signals. In the two fiber sensor embodiments as briefly described as background with reference to FIGS. 1 and 2, this instability may be cancelled by a feedback compensator located in the optical fiber reference arm.

Figure 12:
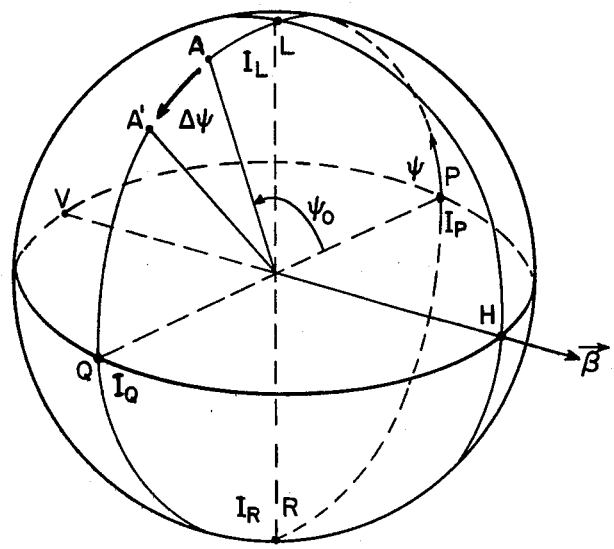
FIG. 12 represents a Poincare' sphere used to explain the state of polarization of the light used in the embodiments of FIGS. 3, 4, 5, 8 and 9.

The FIG. 8 embodiment overcomes environmentally induced phase shifts by employing both plane and circularly polarized light at the output. FIG. 12 is a representation of the so-called Poincare' sphere, and the detection scheme in FIG. 8 can be described by utilizing its representation of polarization. Fiber birefringence may be represented by the rotation vector $\beta$ lying in the equatorial plane through VH. All SOP's rotate on the sphere about this vector as they propagate through the fiber, and, in particular, for an input at $\pi/4$ (45°) to the eigenmodes, the SOP rotates in the great circle PLQR. The output SOP is represented by A and, in general, $\psi_o = \beta l \gg \pi/2$ where l is the fiber length. The physical field to be detected rotates the output SOP through $\Delta\psi$ to A'. The quadrature condition corresponds to $\psi_o = (n+\frac{1}{2})\pi$, for n integer, but environmental perturbations cause $\psi_o$ to drift randomly.

Note in FIG. 12 the representations $I_P$, $I_Q$, $I_L$ and $I_R$. P denotes linear polarization at +45°, Q denotes linear polarization at −45°, L denotes left circular polarization, and R denotes right circular polarization.

Referring again to FIG. 8, linear polarized light is coupled into optical fiber 210 at $\pi/4$ (45°) to its birefringence eigenmodes, exciting them equally. For convenience the optical fiber eigenmodes are considered as oriented horizontally (H) and vertically (V) with reference to the Poincare' sphere. In FIG. 8, quarter wave plate 250 and Wollaston prism 224 separate collimated light output from lens 222 into four polarization states 225, 227, 325 and 327 which are detected separately as $I_P$, $I_Q$, $I_L$ and $I_R$, respectively. These polarization states are linear at azimuth $\pi/4$ (P and Q) to the fiber eigenmodes, and left and right circular (L and R). When the state of polarization as seen by detectors 226 and 228 (sensing states P and Q) is out of quadrature, the same state of polarization as seen by detectors 326 and 328 (sensing state L and R) is in quadrature. Suitable electronic processing of the signals $I_P$, $I_Q$, $I_L$ and $I_R$ by the four detectors produce an output signal S which is independent of environmental perturbations.

The intensities in the four states (P, Q, L and R) in the FIG. 8 embodiment are detected separately and processed in pairs to give the signals $$T_{PQ} = (I_P - I_Q)/(I_P + I_Q) = \cos(\psi_o + \Delta\psi)$$

$$T_{LR} = (I_L - I_R)/(I_L + I_R) = \sin(\psi_o + \Delta\psi)$$

where $\Delta\psi = \overline{\Delta\psi} \sin 2\pi f_o t$ is the induced phase change at frequency $f_o$ to be detected. Detecting these signals separately by tuned amplifiers of phase sensitive detection at frequency $f_o$ give $$S_{PQ} = -2 J_1 (\Delta\psi) \sin \psi_o$$

$$S_{LR} = 2 J_1 (\Delta\psi) \cos \psi_o$$

where $J_1$ is the first-order Bessel function. Simple electronic processing gives $$S = \sqrt{S^2_{PQ} + S^2_{LR}} = 2 J_1 (\Delta\psi)(\Delta\psi).(\text{constant})$$

where $S_{PQ}$ and $S_{LR}$ are voltages representing the signals at frequency $f_o$. Hence, the processed signal S is independent of $\psi_o$. That is, independent of any environmentally induced, low-frequency variation of the fiber output SOP. The sensor is always at maximum sensitivity for small $\Delta\psi$ regardless of $\psi_o$, and there is no need to set the quadrature condition with, for example, a polarization changer, such as a Soleil-Babinet compensator, as illustrated by elements 32 and 36 in the FIGS. 3 and 5 embodiments.

Figure 10:
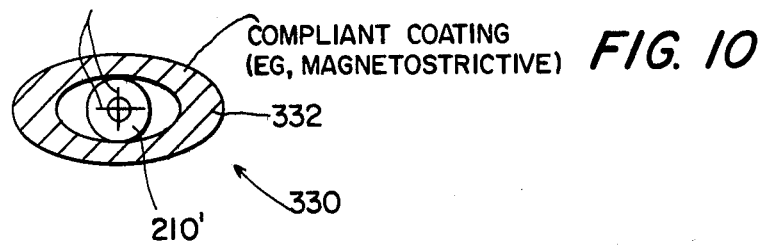
FIG. 10 is a cross sectional view taken along lines 10—10 of FIG. 9 illustrating one type of compliant coating or carrier disposed about an optical fiber.
Figure 11:
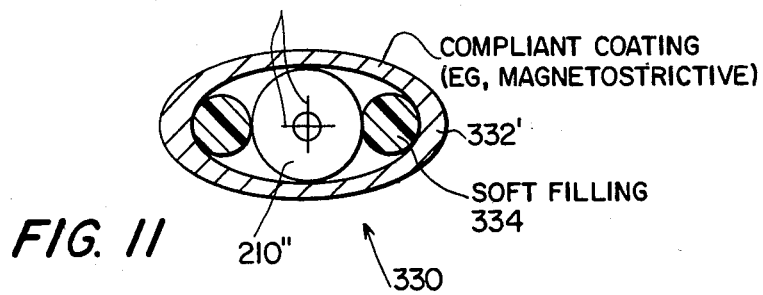
FIG. 11 is another cross sectional view taken along line 11—11 of FIG. 9 illustrating another type of coating or carrier about an optical fiber.

The embodiment illustrated in FIG. 9 essentially follows that disclosed in FIG. 8, except it employs a jacketed extended optical fiber 330 for defining a magnetic or acoustic sensing region. The sensing region is adapted to be disposed in the presence of a magnetic field much in the same manner as mandrel 212 in FIG. 8. In FIG. 10 a thin eliptically shaped magnetostrictive metal coating 332 defining a carrier is disposed about optical fiber 210' with its major and minor axes coinciding with the polarization eigenmodes or fast and slow axes of the fiber. The coating may be formed of a pressure compliant material when an acoustic sound wave is to be detected. In the presence of a magnetic (or acoustic) field, the coating is adapted to undergo dimensional changes to bias the fiber along its eigenmodes. FIG. 11 illustrates in cross section an alternate form of the extended sensor or region carrier. An elliptical coating 332' of magnetostrictive or pressure compliant material surrounds both optical fiber 210'' and soft fillings 134 on either side thereof. This arrangement assures responsive pressure only on one of the axes of the fiber. The length of the extended sensor or sensing region is determined for the particular application to which it is applied, and may range from a few meters up to a kilometer or more. It will be understood that throughout the several embodiments where a magnetostrictive cylindrical or tubular mandrel has been employed to sense magnetic fields, a pressure compliant material may be employed to sense an acoustic fields.

Figure 16:
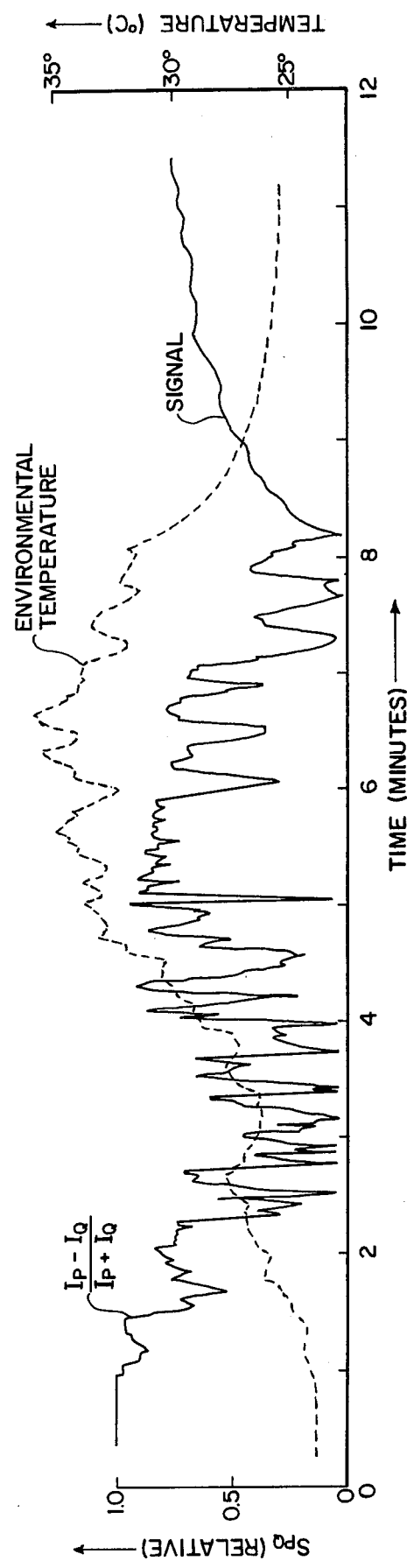
FIG. 16 is an operational graph showing the effect of temperature change on a signal.
Figure 17:
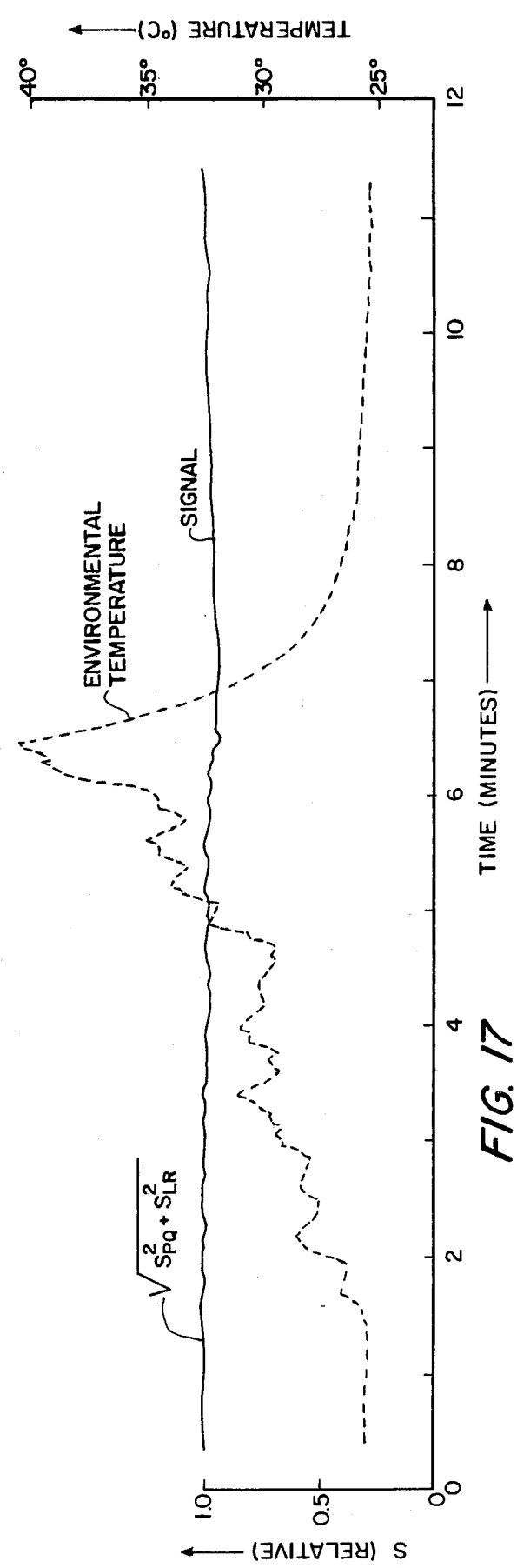
FIG. 17 is another operational graph showing a signal produced by apparatus employing the present invention which is not effected by temperature change.

A graph reproduced in FIG. 16 illustrates the effect of environmental temperature on the signal processed according to $S_{PQ} = (I_P - I_Q)/(I_P + I_Q)$ only. The graph reproduced in FIG. 17 shows a signal further processed according to $S = \sqrt{S_{PQ}^2 + S_{LR}^2}$ wherein the signal received is independent of environmental temperature.

Figure 13A:
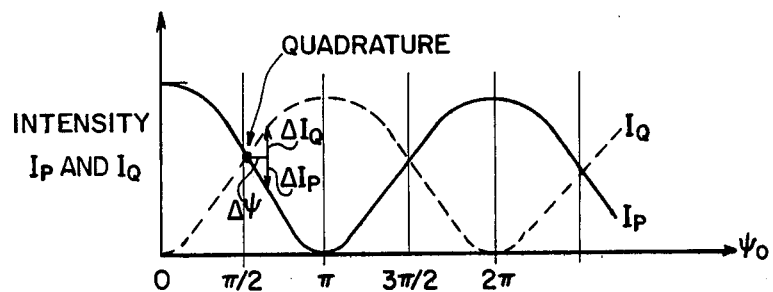
FIGS. 13a and 13b are graphical representations of sensor output with only two output polarization states detected (P and Q).
Figure 13B:
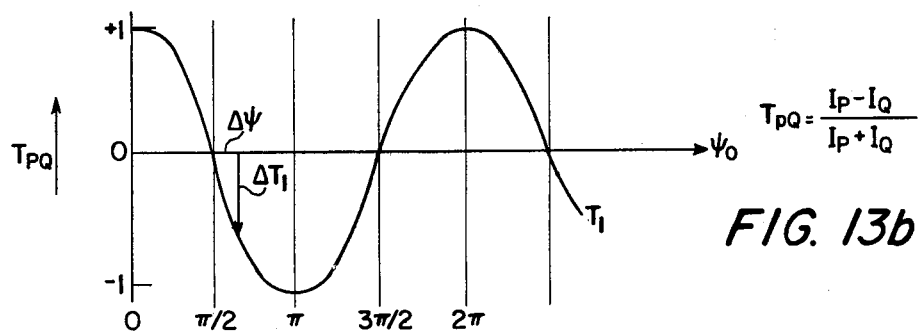

Operation of the detector, as particularly disclosed in FIGS. 8 and 9, is illustrated graphically in FIGS. 13-15. The two output intensities $I_P$ and $I_Q$ vary sinusoidally with the induced differential phase shift as illustrated in FIG. 13a. $\psi_o$ is the difference between the phases of light that has propagated (through fiber 210 in FIG. 8, for example) in the two polarization eigenmodes, namely vertical V polarization and horizontal H polarization (note Poincare' sphere, FIG. 12). It is desirable to operate the detector with its outputs in quadrature. This point is the position of maximum sensitivity and corresponds to a phase difference of $\pi/2$ between the polarization eigenmodes as illustrated in FIG. 13a. By operating at the quadrature point ($\psi_o = \pi/2$), it is readily apparent that a small shift ($\Delta\psi$) causes a noticable change in both $I_P$ and $I_Q$. FIG. 13b illustrates the normalized ratio $T_{PQ}=(I_P-I_Q)/(I_P+I_Q)$. It will be noted in both FIGS. 13a and 13b that a small shift ($\Delta\psi$) provides a large change in $T_{PQ}$ if $\psi_o=\pi/2$.

Figure 14A:
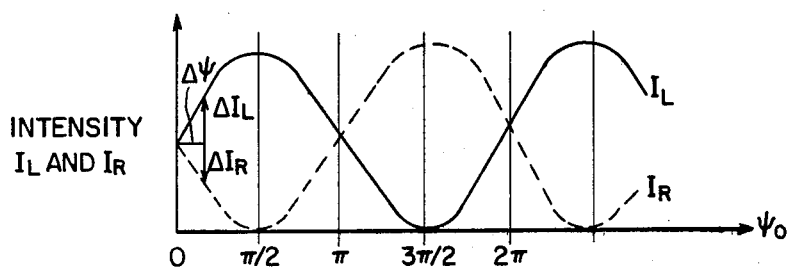
FIGS. 14a and 14b are graphical representations of sensor output with two other polarization states detected (L and R).
Figure 14B:
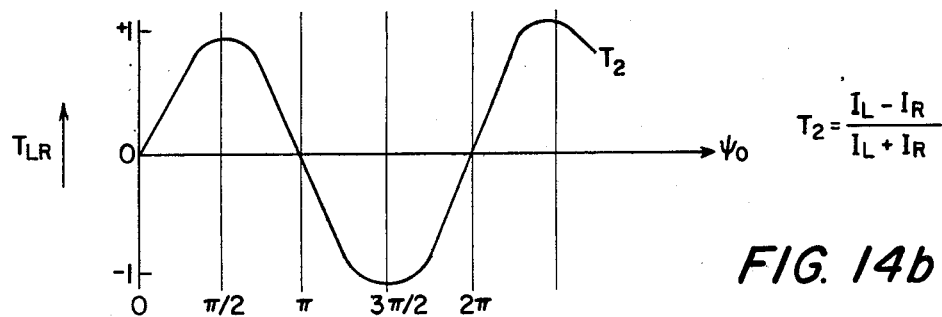

FIGS. 14a and 14b illustrate the two additional output polarization states L and R that are detected by the arrangement described with reference to FIGS. 8 and 9. It will be noted in FIG. 14a that both the $I_L$ and $I_R$ sine curves are shifted in phase by 90° with respect to the $I_P$ and $I_Q$ curves in FIG. 13a. This shift is acomplished with an appropriately oriented quarter wave plate 250 which is shown in FIGS. 8 and 9. This 90° phase shift is an important feature of the invention. With reference to FIG. 14a, it is shown again that a small phase change ($\Delta\psi$) between the eigenmodes cause a substantial change in the intensities of $I_L$ and $I_R$. It will be noted, however, that the quadrature point is at $\psi_o=0$ instead of $\psi_o=\pi/2$ as in FIG. 13a.

When $\psi_0=\pi/2$ the signal resulting from $\Delta\psi$ as seen by $I_P$ and $I_Q$ (equivalently $T_{PQ}$) is at maximum sensitivity, while the signal as seen by $I_L$ and $I_R$ (equivalently $T_{LR}$) is at minimum sensitivity. The reverse is true if $\psi_o=0$. As described below, the two signals $T_{PQ}$ and $T_{LR}$ are combined in such a way that the signal is at maximum sensitivity regardless of the value of $\psi_o$. As previously described, $\psi_o$ is the phase difference between the light in the two polarization eignemodes, and it drifts as the environment (e.g. temperature) changes.

Figure 15A:
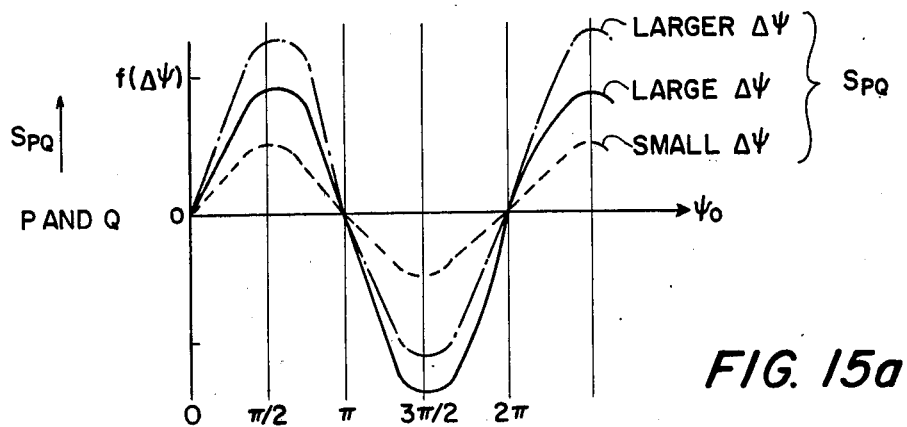
FIGS. 15a–15c are graphical representations of variations of detected signals with $\psi_o$.
Figure 15B:
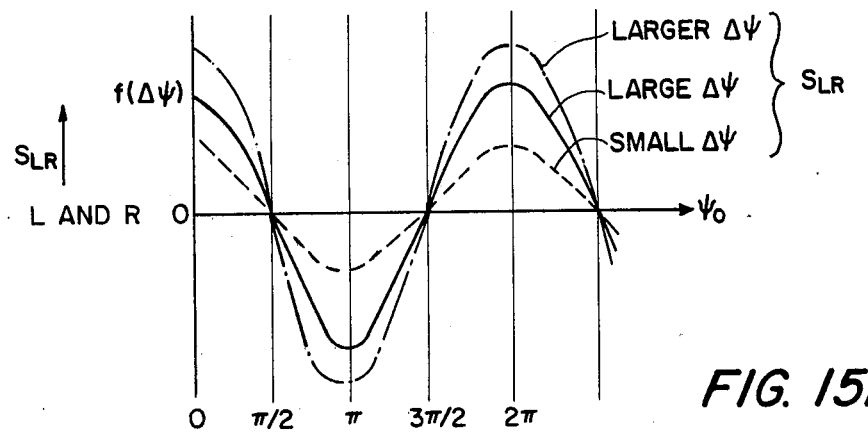
Figure 15C:
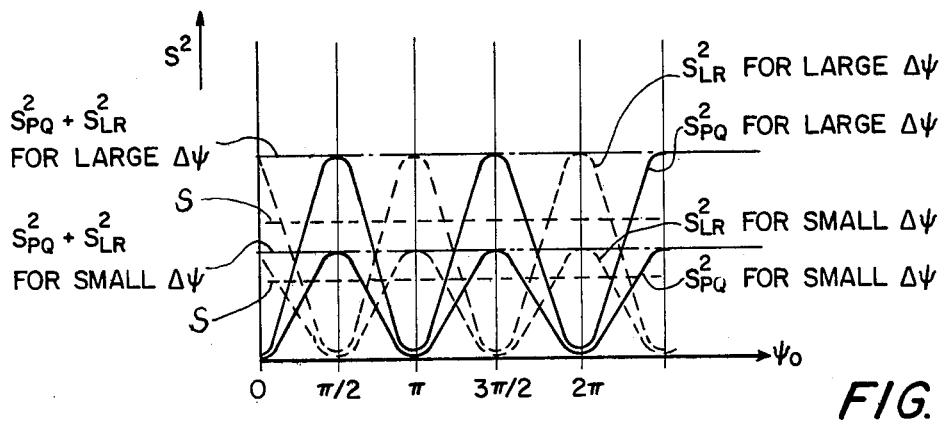

The magnitude of the signal detected (as a result of $\Delta\psi$) depends upon the value of $\psi_0$. FIG. 15a shows how the signal $S_{PQ}$ (as given by $T_{PQ}$) varies as the bias phase difference $\psi_o$ varies. It is 0 for $\psi_o=0$ and maximum for $\psi_o=\pi/2$. It has a sine curve slope, and its amplitude depends upon the magnitude of the induced phast shift $\Delta\psi$. Likewise, signal $S_{LR}$ (as given by $T_{LR}$) varies with $\psi_o$ according to a cosine curve illustrated in FIG. 15b. The amplitude of this cosine curve depends upon the induced differential phase shift $\Delta\psi$. The process makes use of a mathematical identity to combine signals $S_{PQ}$ and $S_{LR}$ such that they provide a constant maximum signal regardless of how $\psi_o$ changes with the environment. To accomplish this, $SP_{PQ}$ and $S_{LR}$ are squared, added, and the square root taken of their sum. This procedure can be done simply with electronics. It is illustrated graphically in FIG. 15c where the signal $S^2=S_{PQ}{}^2+S_{LR}{}^2$ is a straight line for all values of $\psi_o$. This signal $S^2$ is then square rooted (electrically) to give S directly. If $\Delta\psi$ is larger, the level of line S shifts upwards, but it does not change as $\psi_o$ changes (i.e. it remains a straight line for all $\psi_o$). This is illustrated by the horizontal dashed line. The output signal S does not depend upon the value of $\psi_o$. It depends only on $\Delta\psi$ and is always at a maximum.

While the invention has been shown and described with reference to specific embodiments, it will be understood by those skilled in the art that various changes in form and detail may be made thereto without departing from the spirit and scope of the invention which is limited only by the claims annexed hereto.

What is claimed is:

1. A method of sensing a field condition with minimum disturbance from low frequency environmentally induced perturbations comprising the steps of:
   propagating polarized light through an optical fiber made birefringent to have two orthogonally disposed modes oriented respectively along fast and slow axes;
   allowing a field condition to stress a length of the optical fiber in axes directions for changing its birefringence;
   splitting one portion of the light emanating from the optical fiber into first and second components of linearly polarized light;
   phase shifting another portion of the light emanating from the optical fiber by 90° and splitting it into a third component of left circularly polarized light and a fourth component of right circularly polarized light;
   monitoring the intensities of the first and second linearly polarized orthogonal light components to produce respective first and second electrical signals and combining the first and second electrical signals to filter out low frequency perturbations to provide a third electrical signal proportional to the field condition induced stresses in the optical fiber;
   at the same time monitoring the intensities of the third and fourth circularly polarized light components to produce respective fourth and fifth electrical signals and combining the fourth and fifth electrical signals to filter out low frequency perturbations to provide a sixth electrical signal proportional to the field condition induced stresses in the optical fiber, and which the sixth electrical signal is shifted in phase by 90° relative to the third electrical signal; and,
   combining the third and sixth electrical signals to produce an output electrical signal which is independent of low frequency environmentally induced perturbations.

2. The method according to claim 1 further defined by the step of tension coiling the optical fiber to a small diameter to make it birefringent.

3. The method according to claim 1 or 2, wherein:
   said step of combining said first and second electrical signals to provide said third electrical signal comprises the step of dividing the difference between said first and second electrical signals by the sum of said first and second electrical signals;
   said step of combining said fourth and fifth electrical signals to provide said sixth electrical signal comprises the step of dividing the difference between said fourth and fifth electrical signals by the sum of said fourth and fifth electrical signals; and
   said step of combining said third and sixth electrical signals to produce said output electrical signal comprises the step of taking the square root of the sum of the squares of said third and sixth electrical signals.

4. The method of claim 1 or 2 further defined by the step of exciting both orthogonal modes equally in propagating polarized light through the optical fiber.

5. The method according to claim 1 or 2 further defined by launching polarized light into the optical fiber at 45° relative to its fast and slow axes.

6. The method according to claim 1 or 2 wherein a length of the optical fiber is stressed by coiling it about a pressure compliant cylindrical member and exposing it to an acoustic field condition.

7. The method according to claim 1 or 2 wherein a length of the optical fiber is stressed by tension coiling it about a cylindrical member of magnetostrictive material and exposing it to a magnetic field condition.

8. The method according to claim 1 or 2 further defined by splitting the linear polarized light at 45° to the fibers fast and slow axes.

9. The method according to claim 1 or 2 further defined by the step of field condition stressing a length of the optical fiber transversely to its fast axis for increasing its birefringence.

10. The method according to claim 1 or 2 further defined by the step of field condition stressing a length of the optical fiber in a direction aligned with its fast axis for decreasing its birefringence.

11. A sensor for sensing a field condition with minimum disturbance from environmentally induced perturbations comprising:

a sensing region defined by a length of single mode birefringent optical fiber made birefringent to have two orthogonally disposed eigenmodes oriented respectively along fast and slow axes, said optical fiber being disposed on a carrier;

means for launching linear polarized light into one end of the optical fiber at 45° to its fast and slow axes for propagation therethrough along its length and emanating at the other end;

said carrier adapted to undergo dimensional changes in response to the field condition to strain the birefringent fiber relative to its axes for changing the birefringence thereof;

means for splitting one portion of the light emanating from the optical fiber other end into first and second components of linearly polarized light which are at 45° to the optical fiber fast and slow axes;

a quarter wave plate in another portion of the polarized light emanating from the optical fiber end for introducing a differential 90° phase shift therein;

means for splitting the phase shifted light into a third component of left circularly polarized light and a fourth component of right circularly polarized light;

means for monitoring the intensities of the first and second linearly polarized light components to produce first and second electrical signals respectively and for combining the first and second electrical signals to filter out low frequency perturbations to provide a third electrical signal proportional to stresses in the optical fiber induced by the field condition;

means for monitoring the intensities of the third and fourth circularly polarized light components to produce fourth and fifth electrical signals respectively and for combining the fourth and fifth electrical signals to filter out low frequency perturbations to provide a stress induced sixth electrical signal which is phase shifted by 90° relative to the third electrical signal;

means for combining the third and sixth electrical signals to produce an output electrical signal which is independent of low frequency environmentally induced perturbations.

12. The invention according to claim 11 wherein the carrier is a pressure complaint mandrel having a cylindrical surface on which the optical fiber is tension wound whereby acoustic waves are adapted to cause the mandrel to strain the optical fiber.

13. The invention according to claim 11 wherein the carrier is a tubular mandrel member of magnetostrictive material and the optical fiber is tension wound about the wall thereof to strain it to induce birefringence whereby a magnetic field condition causes the material to undergo dimensional changes to further strain the optical fiber relative to its axes.

14. The invention according to claim 13 wherein the optical fiber is disposed in the wall of the magnetostrictive tubular member.

15. The invention according to claim 14 wherein the optical fiber is secured to the magnetostrictive material in the wall.

16. The invention according to claim 12, 13, 14 or 15 wherein the optical fiber fast axis is disposed normal to the mandrel surface whereby dimensional changes thereof change fiber birefringence.

17. The invention according to claim 11 wherein the carrier is an elongate elliptical body of magnetostrictive material coextensively surrounding an intrinsically birefringent optical fiber having orthogonally disposed fast and slow axes.

18. The invention according to claim 17 wherein major and minor axes of the elliptical body are aligned with the fast and slow axes of the intrinsically birefringent optical fiber wherein dimensional changes in the elliptical body induced by a magnetic field condition cause the elliptical body to strain the fiber along its axes to change its birefringence.

* * * * *